(12) United States Patent
Kinoshita

(10) Patent No.: US 10,396,149 B2
(45) Date of Patent: Aug. 27, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Akimasa Kinoshita, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/793,202

(22) Filed: Oct. 25, 2017

(65) Prior Publication Data

US 2018/0138264 A1  May 17, 2018

(30) Foreign Application Priority Data

Nov. 16, 2016 (JP) .................................. 2016-223536

(51) Int. Cl.
| | |
|---|---|
| H01L 29/06 | (2006.01) |
| H01L 21/04 | (2006.01) |
| H01L 29/10 | (2006.01) |
| H01L 29/36 | (2006.01) |
| H01L 29/423 | (2006.01) |
| H01L 29/66 | (2006.01) |
| H01L 29/78 | (2006.01) |
| H01L 21/02 | (2006.01) |
| H01L 29/08 | (2006.01) |

(Continued)

(52) U.S. Cl.
CPC ...... *H01L 29/063* (2013.01); *H01L 21/02576* (2013.01); *H01L 21/02579* (2013.01); *H01L 21/0465* (2013.01); *H01L 29/0623* (2013.01); *H01L 29/0882* (2013.01); *H01L 29/1095* (2013.01); *H01L 29/36* (2013.01); *H01L 29/4236* (2013.01); *H01L 29/66727* (2013.01); *H01L 29/66734* (2013.01); *H01L 29/7813* (2013.01); *H01L 29/1608* (2013.01); *H01L 29/2003* (2013.01); *H01L 29/41766* (2013.01); *H01L 29/7827* (2013.01)

(58) Field of Classification Search
CPC .......................... H01L 29/063; H01L 29/7827
See application file for complete search history.

(56) References Cited

U.S. PATENT DOCUMENTS

| | | | |
|---|---|---|---|
| 2004/0195618 A1* | 10/2004 | Saito | H01L 29/0634 257/330 |
| 2011/0024831 A1 | 2/2011 | Nakano | |

(Continued)

FOREIGN PATENT DOCUMENTS

JP  2009-260253 A  11/2009

*Primary Examiner* — Farun Lu
(74) *Attorney, Agent, or Firm* — Rabin & Berdo, P.C.

(57) ABSTRACT

A semiconductor device includes a wide-bandgap semiconductor substrate of a first conductivity type, a wide-bandgap semiconductor layer of the first conductivity type provided on a front surface of the wide-bandgap semiconductor substrate of the first conductivity type, a base region of a second conductivity type selectively provided in a surface layer of the wide-bandgap semiconductor layer of the first conductivity type, and a trench having a striped planar pattern. The base regions are cyclically provided in a direction parallel to the trench. At the lower portion of the trench, a portion of the base region extends in a direction parallel to the trench and the base regions are connected to each other.

8 Claims, 8 Drawing Sheets

(51) Int. Cl.
*H01L 29/16* (2006.01)
*H01L 29/417* (2006.01)
*H01L 29/20* (2006.01)

(56) References Cited

U.S. PATENT DOCUMENTS

2016/0247910 A1* 8/2016 Suzuki .............. H01L 29/66068
2018/0315813 A1* 11/2018 Shiomi ............... H01L 21/0465

* cited by examiner

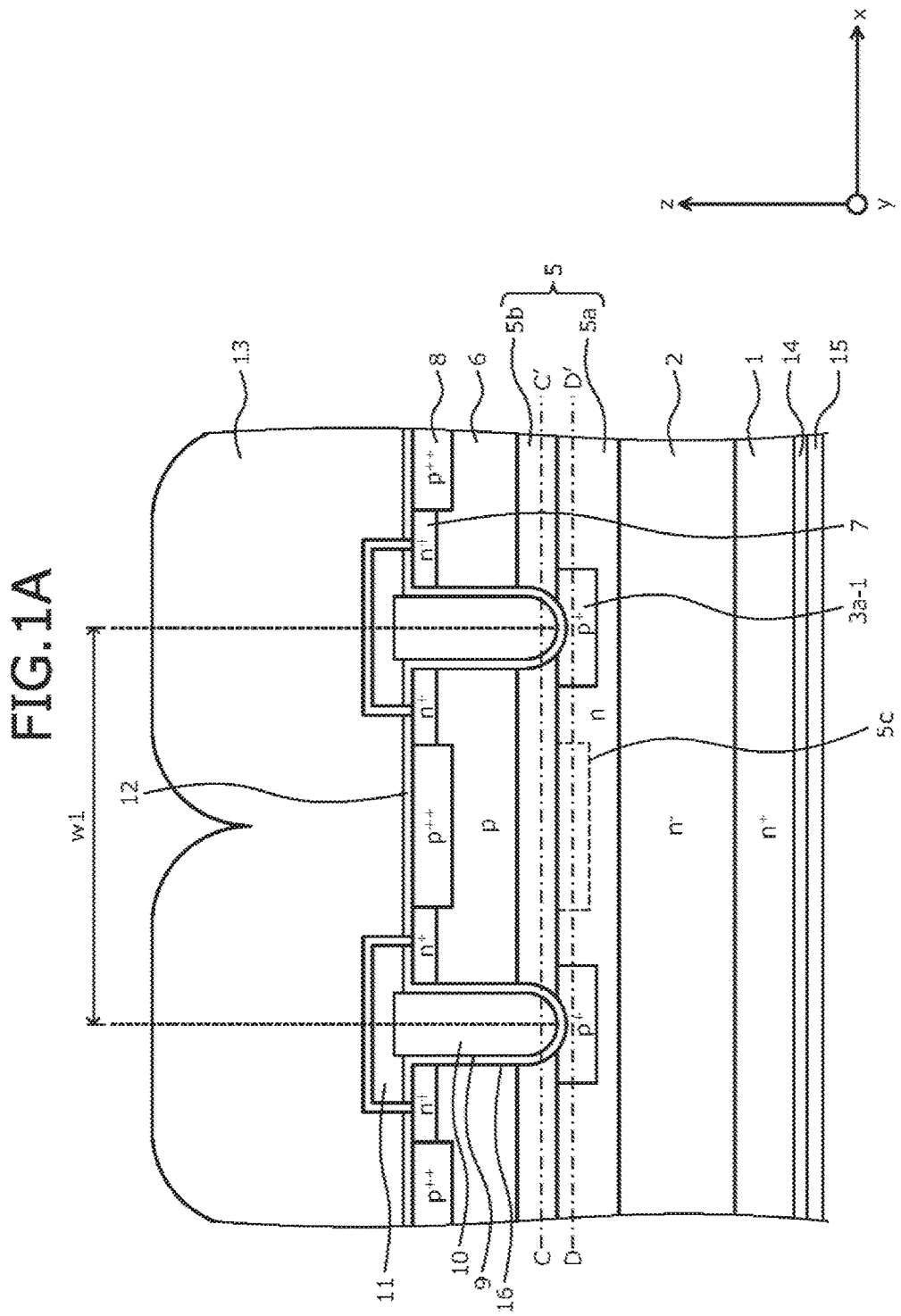

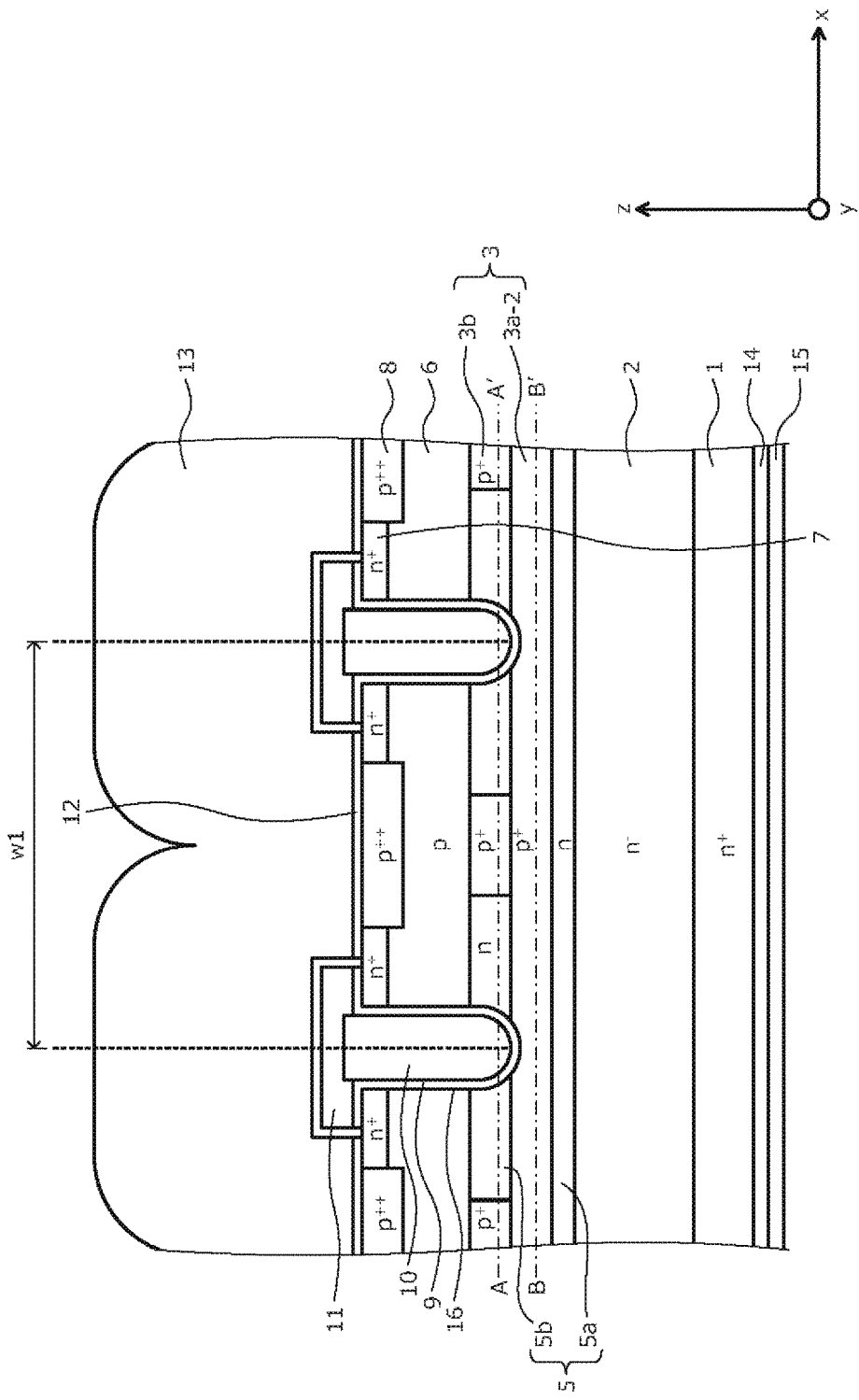

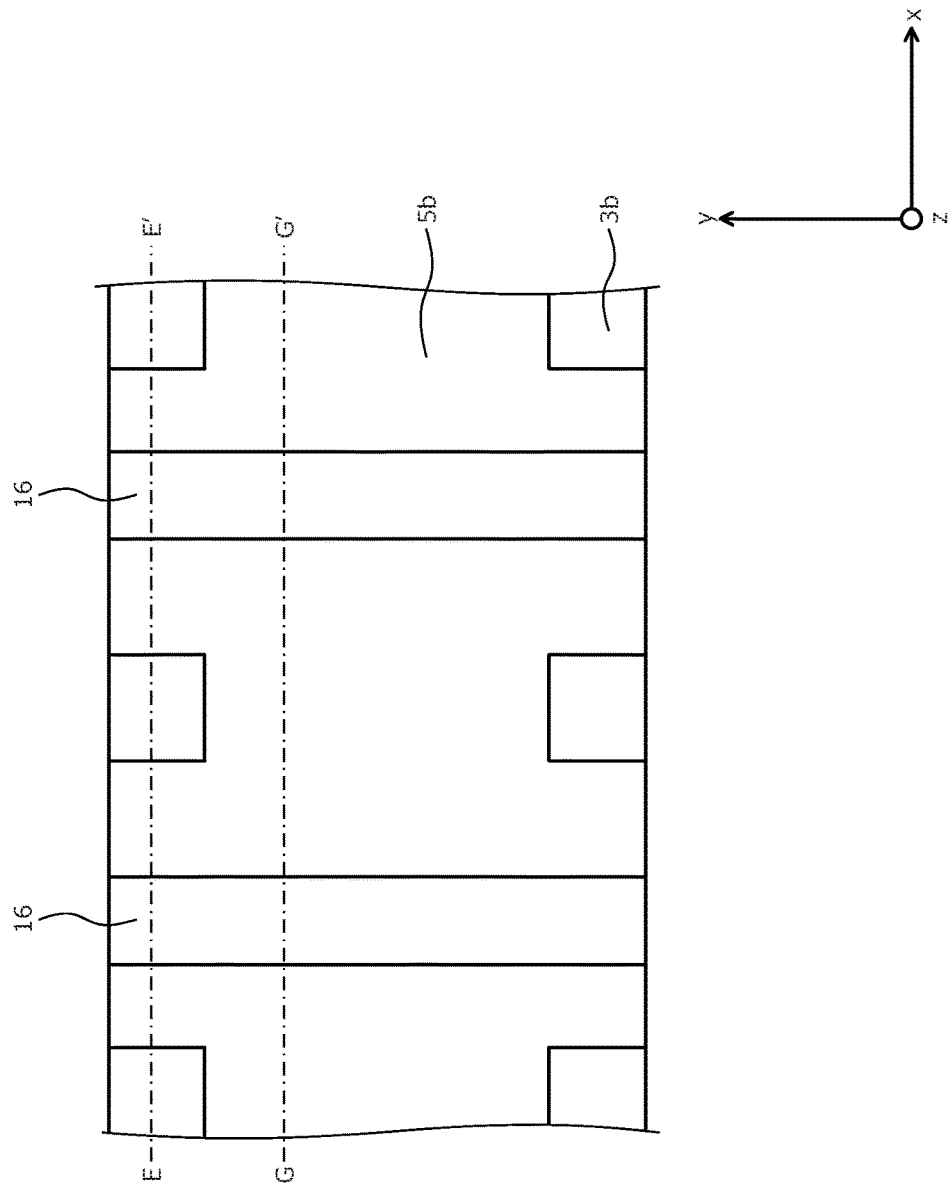

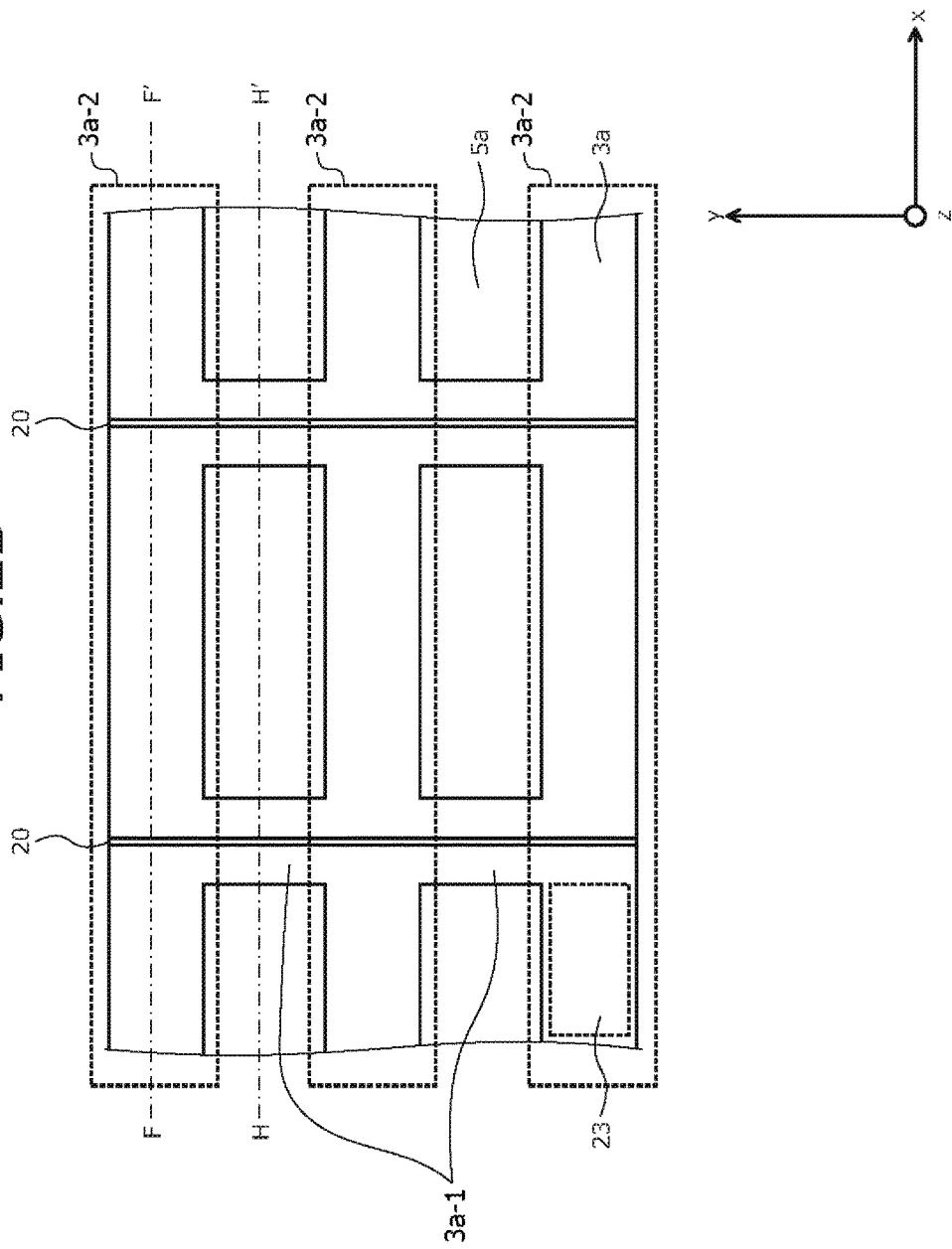

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-223536, filed on Nov. 16, 2016, the entire contents of which are incorporated herein by reference.

BACKGROUND OF THE INVENTION

1. Field of the Invention

The embodiments discussed herein relate to a semiconductor device and a method of manufacturing a semiconductor device.

2. Description of the Related Art

Conventionally, for a power semiconductor element, a vertical metal oxide semiconductor field effect transistor (MOSFET) having a trench structure is produced (manufactured) to facilitate reduction of the on-resistance of the element. With the vertical MOSFET, the current density per unit area can be increased and cost advantages may be achieved because in the trench structure, a channel is formed perpendicularly to the substrate surface, enabling a higher cell density per unit area as compared to that of a planar structure in which the channel is formed parallel to the substrate surface.

When a trench structure is formed in a vertical MOSFET, the structure is such that the inner wall of the trench is entirely covered by a gate insulating film because the channel is formed in the vertical direction. As a result, a portion of the gate insulating film at a bottom portion of the trench approaches a drain electrode and therefore, a high electric field tends to be applied to the portion of the gate insulating film at the bottom portion of the trench. In particular, since ultra-high voltage elements are manufactured with a wide bandgap semiconductor (a semiconductor whose bandgap is wider than that of silicon such as, for example, silicon carbide (SiC)), adverse effects on the gate insulating film at the bottom portion of the trench significantly degrade the reliability of the element.

According to a conventional technique proposed as a method of solving this problem, in a vertical MOSFET having a trench structure and a striped planar pattern, a $p^+$-type base region is provided between trenches, in a striped shape parallel to the trenches (see, e.g., Japanese Laid-Open Patent Publication No. 2009-260253).

FIG. 9 is a cross-sectional view of a configuration of a conventional vertical MOSFET. An $n^-$-type silicon carbide epitaxial layer 102 is deposited on a front surface of an $n^+$-type silicon carbide substrate 101. An n-type region 105 is provided on a surface side opposite to the side of the $n^+$-type silicon carbide substrate 101 of the $n^+$-type silicon carbide epitaxial layer 102. A $p^+$-type base region 103 is selectively provided in a surface layer on a first side of the $n^-$-type silicon carbide epitaxial layer 102 opposite a second side thereof facing the $n^+$-type silicon carbide substrate 101.

The conventional vertical MOSFET further has a p-type base layer 106, an $n^+$-type source region 107, a $p^+$-type contact region 108, a gate insulating film 109, a gate electrode 1010, a drain electrode 1014, and a trench 1016.

"w2" is a width between a center of a trench and a center of an adjacent trench, and indicates the cell pitch of the semiconductor device. In the configuration of the conventional vertical MOSFET, w2 is, for example, about 4 μm.

In the vertical MOSFET having the configuration in FIG. 9, a pn-junction of the $p^+$-type base region 103 and the n-type region 105 is located deeper than the trench 1016 and therefore, the electric field concentrates on the border of the $p^+$-type base region 103 and the n-type region 105. Therefore, concentration of the electric field at the bottom portion of the trench 1016 may be alleviated.

SUMMARY OF THE INVENTION

According to one embodiment of the invention, a semiconductor device includes a wide-bandgap semiconductor substrate of a first conductivity type containing a semiconductor material having a bandgap wider than that of silicon; a first wide-bandgap semiconductor layer of the first conductivity type provided on a front surface of the wide-bandgap semiconductor substrate, the wide-bandgap semiconductor layer containing a semiconductor material having a bandgap wider than that of silicon, an impurity concentration of the wide-bandgap semiconductor layer being lower than that of the wide-bandgap semiconductor substrate; a base region of a second conductivity type selectively provided in a surface layer on a first side of the first wide-bandgap semiconductor layer opposite a second side of the first wide-bandgap semiconductor layer facing toward the wide-bandgap semiconductor substrate; a second wide-bandgap semiconductor layer of the second conductivity type provided on a surface on a first side of the first wide-bandgap semiconductor layer opposite a second side of the first wide-bandgap semiconductor layer facing toward the wide-bandgap semiconductor substrate; a source region of the first conductivity type selectively provided in the second wide-bandgap semiconductor layer; a trench penetrating the source region and the second wide-bandgap semiconductor layer to reach the first wide-bandgap semiconductor layer; a gate electrode provided in the trench, on a gate insulating film; a source electrode contacting the second wide-bandgap semiconductor layer and the source region; and a drain electrode on a rear surface of the wide-bandgap semiconductor substrate. The trench has a striped planar pattern. The base region is cyclically provided only in a direction parallel to the trench. A portion of the base region extends in a direction parallel to the trench at a lower portion of the trench, connecting the base region and an adjacent base region.

In the embodiment, a portion of the base region extends in a direction opposite to a depth of the trench and is connected to the second wide-bandgap semiconductor layer.

In the embodiment, a width of the base region of the lower portion of the trench is larger than a width of the trench.

In the embodiment, a region having an impurity concentration higher than that of the first wide-bandgap semiconductor layer is formed in the surface on the first side of the first wide-bandgap semiconductor layer.

In the embodiment, at least a portion of a bottom of the region formed in the surface on the first side of the first wide-bandgap semiconductor layer protrudes from a bottom of the base region toward the wide-bandgap semiconductor substrate.

In the embodiment, in at least a portion of the region formed in the surface on the first side of the first wide-bandgap semiconductor layer, a region having a higher impurity concentration is formed.

According another embodiment of the invention, a method of manufacturing a semiconductor device includes preparing a wide-bandgap semiconductor substrate of a first conductivity type and containing a semiconductor material whose bandgap is wider than that of silicon; forming a first wide-bandgap semiconductor layer of the first conductivity type on a front surface of the wide-bandgap semiconductor substrate, an impurity concentration of the first wide-bandgap semiconductor layer being lower than that of the wide-bandgap semiconductor substrate; selectively forming a base region of a second conductivity type in a surface layer of the first wide-bandgap semiconductor layer; forming a region of the first conductivity type on the surface layer of the first wide-bandgap semiconductor layer; forming a second wide-bandgap semiconductor layer of the second conductivity type on the surface of the first wide-bandgap semiconductor layer; selectively forming a source region of the first conductivity type in the second wide-bandgap semiconductor layer; forming a trench having a striped planar pattern, the trench penetrating the source region and the second wide-bandgap semiconductor layer to reach the first wide-bandgap semiconductor layer; forming a gate electrode in the trench, on a gate insulating film; forming a source electrode contacting the second wide-bandgap semiconductor layer and the source region; and forming a drain electrode on a rear surface of the wide-bandgap semiconductor substrate. In selectively forming the base region, the base region is cyclically formed only in a direction parallel to the trench, and at a lower portion of the trench, a region is formed in which the base region is connected to an adjacent base region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1A depicts a cross-sectional view taken along a cutting line H-H' in FIG. 2B or G-G' in FIG. 2A;

FIG. 1B depicts a cross-sectional view taken along a cutting line F-F' in FIG. 2B or E-E' in FIG. 2A;

FIG. 2A is a plan diagram of an example of a planar layout taken along a cutting line A-A' in FIG. 1B or C-C' in FIG. 1A;

FIG. 2B is a plan diagram of an example of the planar layout taken along a cutting line B-B' in FIG. 1B or D-D' in FIG. 1A;

DETAILED DESCRIPTION OF THE INVENTION

Figure 3:
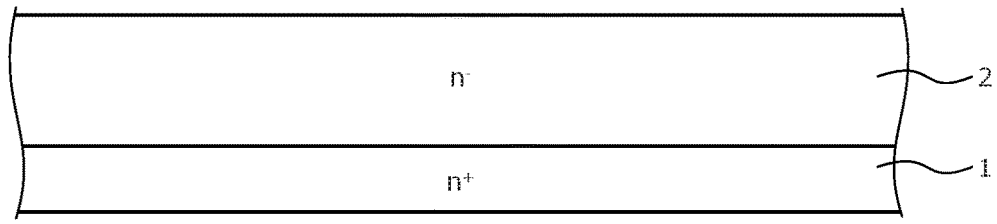
FIGS. 3, 4A, 4B, 5A, 5B, 6, 7, and 8 are cross-sectional views of the silicon carbide semiconductor device according to the embodiment during manufacture.

Problems related to the conventional technique will first be discussed.

With the vertical MOSFET of the conventional technique, the $p^+$-type base region 103 between the trench 1016 and the adjacent trench 1016 is provided in a striped shape parallel to the trench 1016. Therefore, the n-type region 105 to be the drift layer is also provided in a striped shape parallel to the trench 1016. On the other hand, for the striped shape, a pattern whose width is less than 1 μm is difficult to produce due to the processing precision of etching. In the vertical MOSFET of the conventional technique, the striped shape of the $p^+$-type base region 103 and the n-type region 105 parallel to the trench 1016 is provided between the trench 1016 and the adjacent trench 1016. Therefore, a predetermined width is necessitated by problems such as the processing precision of the striped shape and restrictions on the design of the n-type region 105. As a result, the width of the cell pitch w2 between the trench 1016 and the adjacent trench 1016 has to be at least 4 μm. As a result, the width of the cell pitch w2 is difficult to make smaller than 4 μm.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention is formed using a wide bandgap semiconductor. In an embodiment, a silicon carbide semiconductor device manufactured using, for example, silicon carbide (SiC) as the wide bandgap semiconductor will be described taking an example of a MOSFET. However, embodiments of the invention are not limited to silicon carbide, but include any wide bandgap semiconductor. FIGS. 1A and 1B are cross-sectional views of a configuration of the silicon carbide semiconductor device according to the embodiment. FIG. 1 depicts a cross-sectional view taken along a cutting line H-H' in FIG. 2B or G-G' in FIG. 2A, and FIG. 1B depicts a cross-sectional view taken along a cutting line F-F' in FIG. 2B or E-E' in FIG. 2A.

As depicted in FIG. 1A and FIG. 1B, the silicon carbide semiconductor device according to the embodiment has an $n^-$-type silicon carbide epitaxial layer (a first wide-bandgap semiconductor layer of a first conductivity type) 2 deposited on a first main surface (a front surface) that is, for example, a (0001) surface (a Si surface) of an $n^+$-type silicon carbide substrate (a wide-bandgap semiconductor substrate of the first conductivity type) 1.

The $n^+$-type silicon carbide substrate 1 is a silicon carbide, single crystal substrate. The $n^-$-type silicon carbide epitaxial layer 2 has an impurity concentration that is lower than that of the $n^+$-type silicon carbide substrate 1. The $n^-$-type silicon carbide epitaxial layer 2 is, for example, a low concentration n-type drift layer. An n-type region (a region of the first conductivity type) 5 is provided on a surface of a first side of the $n^-$-type silicon carbide epitaxial layer 2 opposite a second side thereof facing the $n^+$-type silicon carbide substrate 1. The n-type region 5 is a high concentration n-type drift layer whose impurity concentration is lower than that of the $n^+$-type silicon carbide substrate 1 and higher than that of the $n^-$-type silicon carbide epitaxial layer 2. The n-type region 5 includes a first n-type region 5a located at a position deeper on a drain side described later than the bottom portion of the trench 16 described later, and a second n-type region 5b located at a position closer to a source side than the bottom portion of the trench 16. The first n-type region 5a may include a region 5c having a high concentration only near the lower portion of a source electrode 12. Avalanche may be prevented from occurring beneath the trench and the reliability may be improved by the structure having an increased concentration in the portion of the first n-type region 5a.

A p-type base layer (a wide-bandgap semiconductor layer of the second conductivity type) 6 is provided on the surface of the first side of the n⁻-type silicon carbide epitaxial layer 2 opposite the second side facing the n⁺-type silicon carbide substrate 1. The p-type base layer 6 contacts a p-type base region 3 described later. Hereinafter, the n⁺-type silicon carbide substrate 1, the n⁻-type silicon carbide epitaxial layer 2, and the p-type base layer 6 will be collectively referred to as "silicon carbide base substrate".

A drain electrode 14 is provided on a second main surface of the n⁺-type silicon carbide substrate 1 (a rear surface, i.e., a rear surface of the silicon carbide semiconductor base substrate). A drain electrode pad 15 is provided on the surface of the drain electrode 14.

A trench structure is formed on the first main surface side of the silicon carbide semiconductor base substrate (the p-type base layer 6 side). For example, the trench 16 penetrates the p-type base layer 6 from the surface of a first side (the first main surface side of the silicon carbide semiconductor base substrate) of the p-type base layer 6 opposite a second side thereof facing toward the n⁺-type silicon carbide substrate 1, the trench 16 reaching the second n-type region 5b. Along an inner wall of the trench 16, a gate insulating film 9 is formed on a bottom portion and side walls of the trench 16 and a gate electrode 10 is formed on the gate insulating film 9 in the trench 16. The gate electrode 10 is insulated from the n⁻-type silicon carbide epitaxial layer 2 and the p-type base layer 6 by the gate insulating film 9. A portion of the gate electrode 10 may protrude from a position above the trench 16 (a side on which a source electrode pad 13 is provided) toward a side of the source electrode pad 13.

The p⁺-type base region (a base region of the second conductivity type) 3 is selectively provided in the surface on the first side (the first main surface side of the silicon carbide base substrate) of the n⁻-type silicon carbide epitaxial layer 2 opposite to the second side facing the n⁺-type silicon carbide substrate 1. The p⁺-type base region 3 reaches a position deeper on the drain side than the bottom portion of the trench 16. A lower end portion of the p⁺-type base region 3 (an end portion on the drain side) is positioned closer to the drain than the bottom portion of the trench 16. The p⁺-type base region 3 includes a first p⁺-type base region 3a at a position deeper toward the drain than the bottom portion of the trench 16, and a second p⁺-type base region 3b at a position closer to the source than the bottom portion of the trench 16.

A pn-junction of the first p⁺-type base region 3a and the n-type region 5 may be formed at a position near the bottom portion of the trench 16 in the depth direction (in the positive direction on a Z-axis) by providing the first p⁺-type base region 3a. High electric field may be prevented from being applied to the gate insulating film 9 at the bottom portion of the trench 16 by forming the pn-junction of the first p⁺-type base region 3a and the n-type region 5 as described above. As a result, even when a wide bandgap semiconductor is used as the semiconductor material, a high breakdown voltage may be achieved. A concentration of electric field at the corner portion of the bottom of the trench 16 may be mitigated by providing the first p⁺-type base region 3a whose width is wider than the trench width whereby the breakdown voltage may be further increased.

FIGS. 2A and 2B are plan diagrams of an example of a planar layout of the silicon carbide semiconductor device according to the embodiment. FIG. 2A is a plan diagram of an example of the planar layout taken along a cutting line A-A' in FIG. 1B or C-C' in FIG. 1A, and FIG. 2B is a plan diagram of an example of the planar layout taken along a cutting line B-B' in FIG. 1B or D-D' in FIG. 1A.

As depicted in FIG. 2A, at a position near the bottom portion of the trench 16, the second p⁺-type base region 3b formed by a portion of the first p⁺-type base region 3a extended in a direction opposite to the depth of the trench 16 (the negative direction on the z-axis) is connected to the p-type base layer 6. Because the base region 3 is connected to the p-type base layer 6 as described, holes generated when avalanche breakdown occurs in the junction portion of the first p⁺-type base region 3a and the n⁻-type silicon carbide epitaxial layer 2 may be evacuated to the source electrode 12 and the load on the gate insulating film 9 may therefore be reduced, improving reliability.

A portion of the first p⁺-type base region 3a (for example, a portion surrounded by a dotted line and denoted by a reference numeral "23" in FIG. 2B) is, for example, a portion that is provided in a direction parallel to the trench 16 and that does not correspond to the lower portion of the trench 16. As a result, because FIG. 1A depicts the cross-section taken along G-G' in FIG. 2A, the second p⁺-type base region 3b is not present between the trench 16 and the adjacent trench 16 in FIGS. 1A and 2A. Because FIG. 1B depicts the cross-section taken along E-E' in FIG. 2A, the second p⁺-type base region 3b in FIG. 1B is the second p⁺-type base region 3b between the trench 16 and the adjacent trench 16 in FIG. 2A.

As depicted in FIG. 2B, at a position deeper than the bottom portion of the trench 16, a portion 3a-2 of the first p⁺-type base region 3a is cyclically provided in a direction parallel to the trench 16 (the direction of the y-axis). The portion 3a-2 has a striped shape extending in a direction perpendicular to the trench 16. A portion of the first p⁺-type base region 3a extends in a direction parallel to the trench 16 at a portion 20 corresponding to the lower portion of the trench 16, and portions 3a-2 are connected to each other. As a result, because FIG. 1A depicts the cross-section taken along H-H' in FIG. 2B, the first p⁺-type base region 3a positioned in the first n-type region 5a in FIG. 1A is a portion 3a-1 that extends in the direction parallel to the trench 16 in FIG. 2B. Because FIG. 1B depicts the cross-section taken along F-F' in FIG. 2B, the first p⁺-type base region 3a positioned in the first n-type region 5a (in the positive direction on the z-axis) in FIG. 1B is the portion 3a2 in FIG. 2B.

As depicted in FIGS. 1A and 1B, in the p-type base layer 6, an n⁺-type source region (a source region of the first conductivity type) 7 and a p⁺⁺-type contact region 8 are selectively provided on the first main surface side of the silicon carbide semiconductor base substrate. The n⁺-type source region 7 and the p⁺⁺-type contact region 8 contact each other.

An interlayer insulating film 11 is provided on the entire first main surface side of the silicon carbide semiconductor base substrate to cover the gate electrode 10 embedded in the trench. A source electrode 12 contacts the n⁺-type source region 7 and the p⁺⁺-type contact region 8 through a contact hole opened in the interlayer insulating film 11. The source electrode 12 is electrically insulated from the gate electrode 10 by the interlayer insulating film 11. A source electrode pad 13 is provided on the source electrode 12.

Although FIG. 1A and FIG. 1B each depict only two cells (each being the structure including the trench 16, the gate insulating film 9, the gate electrode 10, the interlayer insulating film 11, and the source electrode 12), MOS gate (the insulated gate including a metal/an oxide film/a semiconductor) structures of more cells may be arranged in parallel. "w1" is a width between a center of a trench and a center of an adjacent trench, and is the cell pitch of the semiconductor device.

Figure 4A:
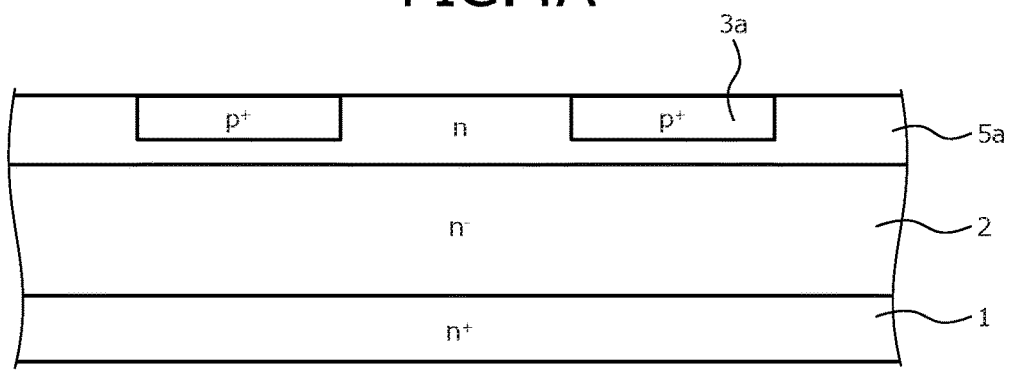
Figure 4B:
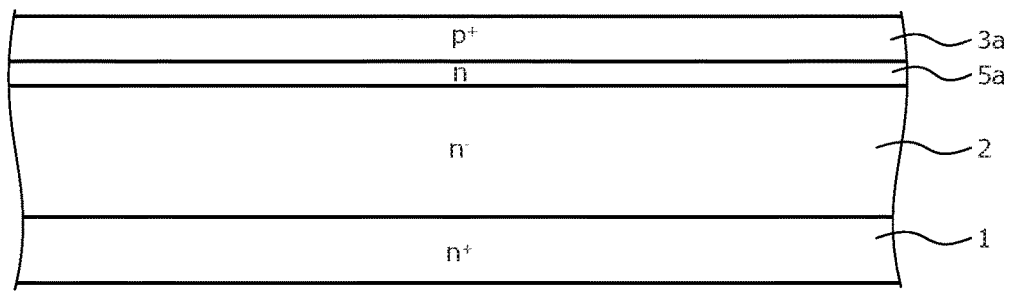
Figure 5A:
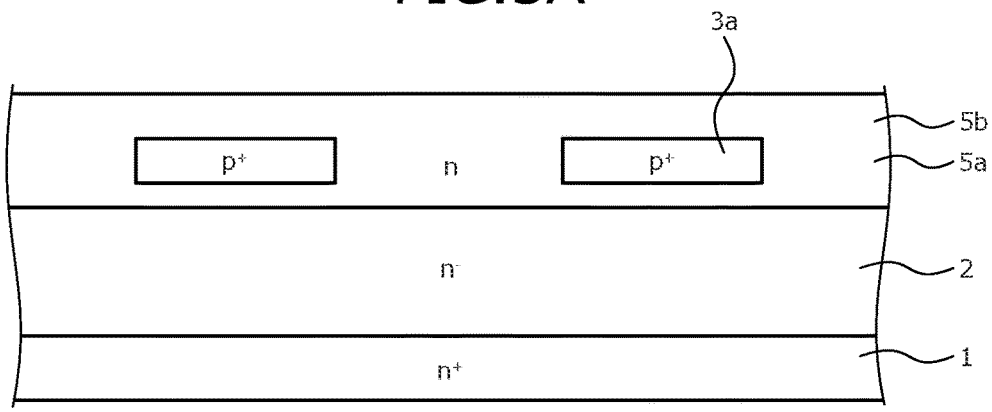
Figure 5B:
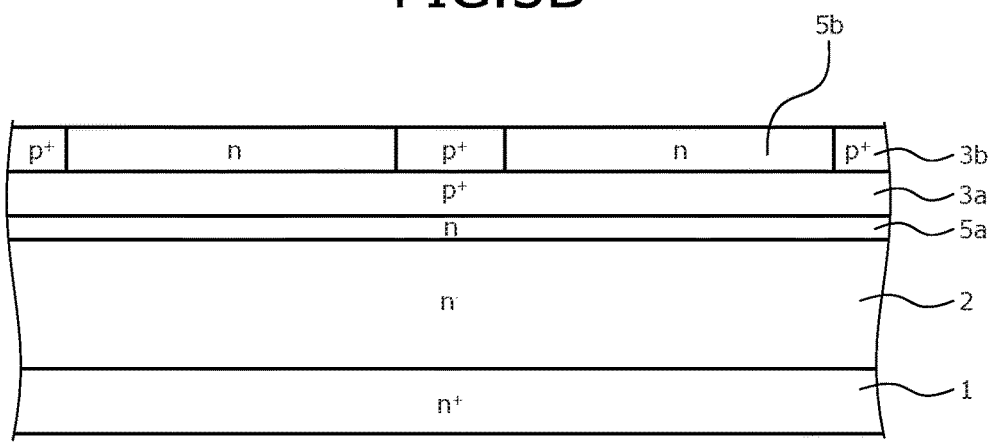

A method of manufacturing a silicon carbide semiconductor device according to the embodiment will be described. FIGS. 3, 4A, 4B, 5A, 5B, 6, 7, and 8 are cross-sectional views of the silicon carbide semiconductor device according to the embodiment during manufacture. FIG. 4A is a cross-sectional view corresponding to FIG. 1A. FIG. 4B is a cross-sectional view corresponding to FIG. 1B. FIG. 5A is a cross-sectional view corresponding to FIG. 1A. FIG. 5B is a cross-sectional view corresponding to FIG. 1B.

The $n^+$-type silicon carbide substrate 1 including n-type silicon carbide is prepared. The $n^-$-type silicon carbide epitaxial layer (a wide-bandgap semiconductor layer of the first conductivity type) 2 including silicon carbide is formed on the first main surface of the $n^+$-type silicon carbide substrate 1 by epitaxial growth to have a thickness up to, for example, about 10 μm and is doped with an n-type impurity such as, for example, nitrogen atoms (N). The state established so far is depicted in FIG. 3.

An n-type impurity such as, for example, nitrogen atoms is implanted into the surface of the $n^-$-type silicon carbide epitaxial layer 2 by ion implantation. As a result, the first n-type region (the region of the first conductivity type) 5a having a depth of, for example, about 0.7 μm is formed in the surface layer of the $n^-$-type silicon carbide epitaxial layer 2. The dose amount for the ion implantation to form the first n-type region 5a may be set such that the impurity concentration is, for example, about $1 \times 10^{17}/cm^3$.

A mask not depicted and including a desired opening is formed on the surface of the first n-type region 5a by a photolithography technique using, for example, an oxide film. Using this oxide film as a mask, a p-type impurity such as, for example, aluminum atoms (Al) is implanted by ion implantation. As a result, the first $p^+$-type base region 3a having the depth of, for example, about 0.5 μm is formed in the surface region of the first n-type region 5a in the surface layer of the $n^-$-type silicon carbide epitaxial layer 2. The first $p^+$-type base region 3a depicted in FIG. 4B is the portion cyclically provided in the direction parallel to the trench 16. The first $p^+$-type base region 3a depicted in FIG. 4A is the portion extending in the direction in parallel to the trench 16. The state established so far is depicted in FIGS. 4A and 4B. FIG. 2B corresponds to a plan diagram of the state established so far.

Next, the mask used for the ion implantation to form the first $p^+$-type base region 3a is removed. The second n-type region 5b including silicon carbide is formed on the surface of the first n-type region 5a and the first $p^+$-type base region 3a by epitaxial growth to have a thickness up to, for example, about 5 μm and is doped with an n-type impurity such as, for example, nitrogen atoms.

A mask not depicted and including a desired opening is formed on the surface of the second n-type region 5b by a photolithography technique using, for example, an oxide film. Using this oxide film as the mask, a p-type impurity such as, for example, aluminum atoms is implanted by ion implantation. As a result, the second $p^+$-type base region 3b is formed in a portion of the second n-type region 5b, of the surface layer of the $n^-$-type silicon carbide epitaxial layer 2. The dose amount for the ion implantation to form the second $p^+$-type base region 3b may be set such that the impurity concentration is, for example, about $5 \times 10^{18}/cm^3$. The state established so far is depicted in FIG. 5A and FIG. 5B. FIG. 2A corresponds to a plan diagram of the state established so far.

The p-type base layer (a wide-bandgap semiconductor layer of the second conductivity type) 6 is form on the surface of the $n^-$-type silicon carbide epitaxial layer 2 (i.e., the surfaces of the second $p^+$-base region 3b and the second n-type region 5b) by epitaxial growth to have a thickness up to, for example, about 1.3 μm and is doped with a p-type impurity such as, for example, aluminum atoms. The condition for the epitaxial growth to form the p-type base layer 6 may be set such that, for example, the impurity concentration is about $2 \times 10^{17}/cm^3$, which is lower than the impurity concentration of the $p^+$-type base region 3. The silicon carbide semiconductor base substrate formed by stacking the $n^-$-type silicon carbide epitaxial layer 2 and the p-type base layer 6 on the $n^+$-type silicon carbide substrate 1 is formed by the steps executed so far.

A mask not depicted and including a desired opening is formed on the surface of the p-type base layer 6 by a photolithography technique using, for example, an oxide film. Using this oxide film as the mask, an n-type impurity such as, for example, phosphorus (P) is implanted by ion implantation. As a result, the $n^+$-type source region (a source region of the first conductivity type) 7 is formed in a portion of the surface layer of the p-type base layer 6. The dose amount for the ion implantation to form the $n^+$-type source region 7 may be set such that the impurity concentration thereof is, for example, higher than that of the $p^+$-type base region 3.

Figure 6:
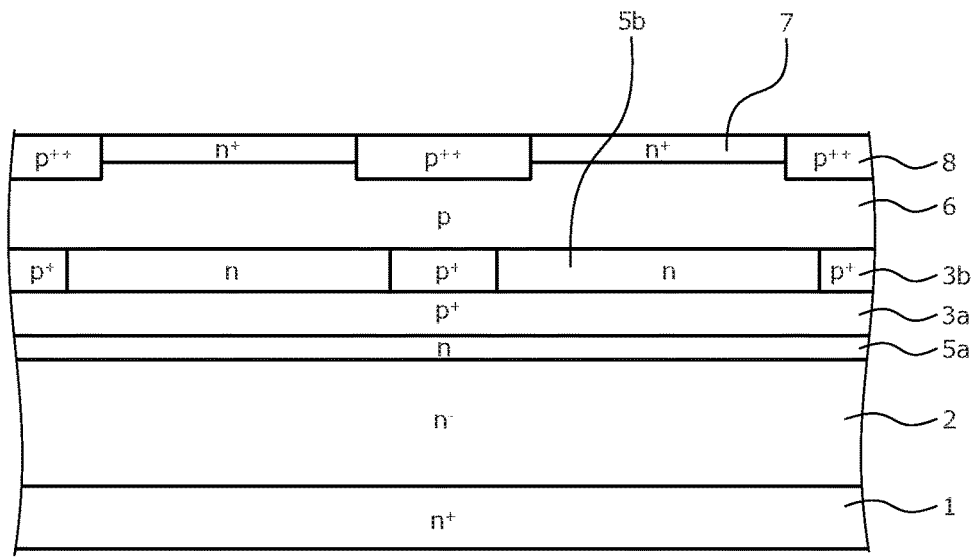
Figure 7:
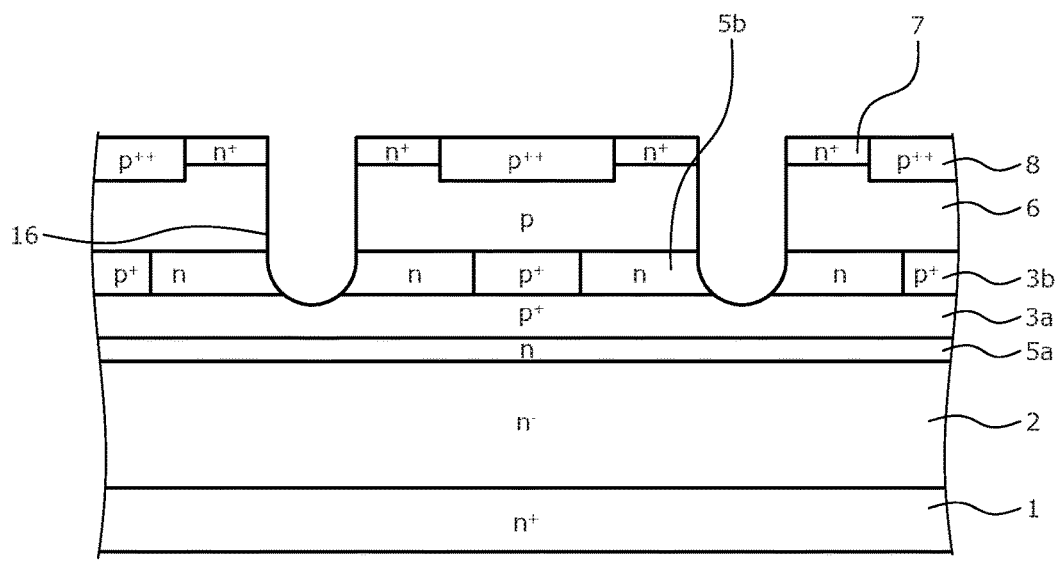
Figure 8:
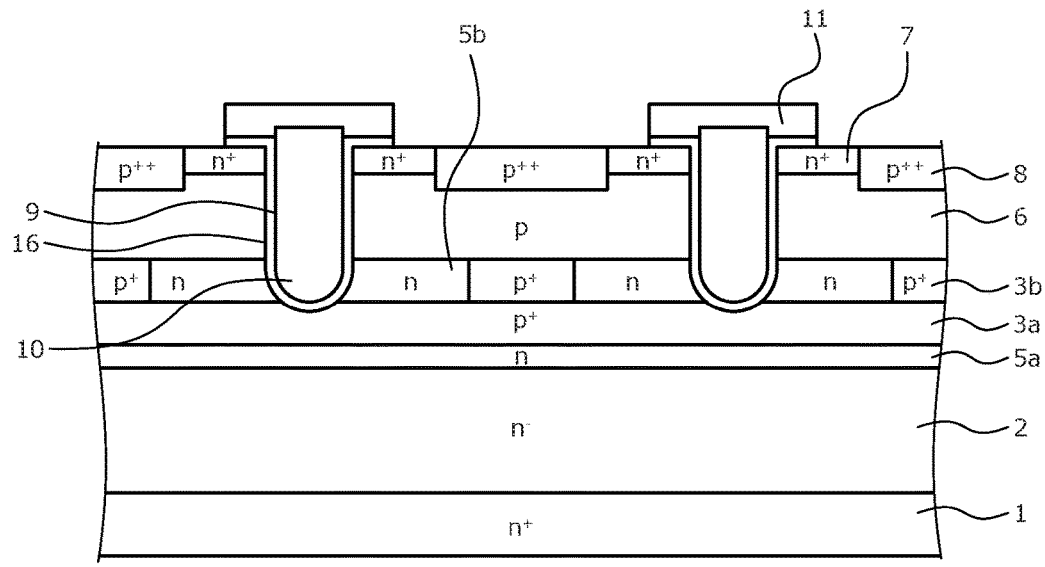
Figure 9:
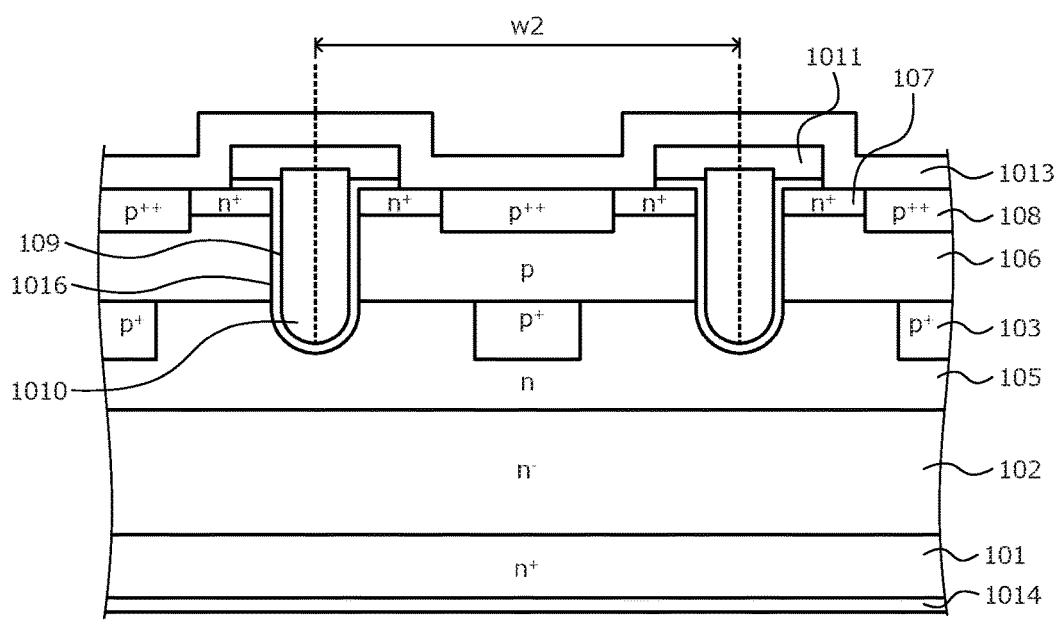
FIG. 9 is a cross-sectional view of a configuration of a conventional vertical MOSFET.

The mask used for the ion implantation to form the $n^+$-type source region 7 is removed. A mask not depicted and including a desired opening is formed on the surface of the p-type base layer 6 by a photolithography technique using, for example, an oxide film. Using this oxide film as the mask, a p-type impurity such as, for example, aluminum is ion-implanted into the surface of the p-type base layer 6. As a result, the $p^{++}$-type contact region 8 is formed in the portion of the surface region of the p-type base layer 6. The dose amount for the ion implantation to form the $p^{++}$-type contact region 8 may be set such that the impurity concentration is, for example, higher than that of the p-type base layer 6. The mask used for the ion implantation to form the $p^{++}$-type contact region 8 is removed. The order of the ion implantation to form the $n^+$-type source region 7 and the ion implantation to form the $p^{++}$-type contact region 8 may be interchanged with each other. The state established so far is depicted in FIG. 6. FIGS. 6 to 8 depict the formation of regions located higher (in the positive direction on the z-axis in FIG. 1) than the surfaces of the second $p^+$-type base region 3b and the second n-type region 5b common to FIG. 1A and FIG. 1B and therefore, the cross-sectional views corresponding to FIG. 1B are presented depicting the states during manufacturing.

Heat treatment (annealing) is executed to activate, for example, the first $p^+$-type base region 3a, the second $p^+$-type base region 3b, the $n^+$-type source region 7, and the $p^{++}$-type contact region 8. The temperature of the heat treatment may be, for example, about 700 degrees C. The time period of the heat treatment may be, for example, about 2 minutes. The ion-implanted regions may be activated collectively in one heat treatment session as above, or heat treatment may be executed for each of the ion-implanted regions to be activated when the ion implantation for the ion-implanted region is executed.

A mask not depicted and including a desired opening is formed on the surface of the p-type base layer 6 (i.e., the surfaces of the n$^+$-type source region 7 and the p$^{++}$-type contact region 8) by a photolithography technique using, for example, an oxide film. Using this oxide film as a mask, the trench 16 penetrating the n$^+$-type source region 7 and the p-type base region 6 and reaching the n-type region 5 is formed by dry etching or the like. The bottom portion of the trench 16 reaches the first p$^+$-type base region 3a. The mask used to form the trench 16 is removed. The state established so far is depicted in FIG. 7.

The gate insulating film 9 is next formed along the surface of the n$^+$-type source region 7 and the p$^{++}$-type contact region 8, and the bottom portion and the side walls of the trench 16. The gate insulating film 9 may be formed by thermal oxidation at a temperature of about 1000 degrees C. in an oxygen atmosphere. The gate insulating film 9 may be formed by a method of depositing the film using a chemical reaction such as high temperature oxidation (HTO).

A polysilicon layer having, for example, phosphorus atoms doped therein is formed on the gate insulating film 9. The polysilicon layer is formed to be embedded in the trench 16. The gate electrode 10 is formed by patterning the polysilicon layer to cause the polysilicon layer to remain inside the trench 16. A portion of the gate electrode 10 may protrude from a position above the trench 16 (the side having the source electrode pad 13 provided thereon) toward the source electrode pad 13.

The interlayer insulating film 11 is formed by forming a film of, for example, phosphorus glass to have a thickness of about 1 μm and to cover the gate insulating film 9 and the gate electrode 10. The contact hole is formed by patterning and selectively removing the interlayer insulating film 11 and the gate insulating film 9 to expose the n$^+$-type source region 7 and the p$^{++}$-type contact region 8. Heat treatment (reflow) is thereafter executed to planarize the interlayer insulating film 11. The state established so far is depicted in FIG. 8.

A conductive film to be the source electrode 12 is formed in the contact hole and on the interlayer insulating film 11. The source electrode 12 is caused to remain only in, for example, the contact hole by selectively removing the conductive film.

The drain electrode 14 made from, for example, nickel (Ni) is formed on the second main surface of the n$^+$-type silicon carbide substrate 1. Heat treatment is thereafter executed at a temperature of, for example, about 970 degrees C. to cause the n$^+$-type silicon carbide substrate 1 and the drain electrode 14 to form an ohmic junction with each other.

For example, an aluminum film is formed by, for example, a sputtering method to have a thickness of, for example, about 5 μm and to cover the source electrode 12 and the interlayer insulating film 11. The source electrode pad 13 is thereafter formed by selectively removing the aluminum film to cause the aluminum film to remain covering the active portion of the overall element. The "active portion" refers to the portion through which current flows when the element structure formed therein is in the on-state.

Next, the drain electrode pad 15 is formed by sequentially stacking, for example, titanium (Ti), nickel (Ni), and gold (Au) on the surface of the drain electrode 14. In this manner, the semiconductor device depicted in FIGS. 1A and 1B is completed.

As described, according to the embodiment, because the p$^+$-type base region is cyclically provided only in the direction parallel to the trench, the striped shape of the p$^+$-type base region and the n$^+$-type region parallel to the trench and needing a width of at least 1 μm is not present between the trench and the adjacent trench. As a result, the problems concerning the processing precision of the striped shape and concerning the design of the n$^+$-type region are not present between the trench and the other trench, and the width of the cell pitch may be reduced. As a result, the width of the cell pitch may be reduced to be less than 4 μm and the chip size may be reduced.

Because the cell pitch of the semiconductor device may be reduced, the cell density per unit area may be increased for the same chip size and a semiconductor device having reduced on-resistance may be manufactured in an area equal to that of the conventional technique.

The ratio of the area of the p$^+$-type base region to the area of the n$^+$-type region may be reduced by cyclically providing the p$^+$-type base region in the direction parallel to the trench. As a result, when the width of the cell pitch is equal to that of the conventional technique, the on-resistance may be reduced and the breakdown voltage of the semiconductor device may be improved.

At a position near the bottom portion of the trench, the second p$^+$-type base region to be the portion of the first p$^+$-type base region extended in the direction opposite to the depth of the trench (the negative direction of the z-axis) is connected to the p-type base layer. Because the base region 3 is connected to the p-type base layer 6 as described, holes generated when avalanche breakdown occurs in the junction portion of the first p$^+$-type base region 3a and the n$^-$-type silicon carbide epitaxial layer 2 may be evacuated to the n$^+$-type source region 7, and the load on the gate insulating film 9 may be alleviated. As a result, the reliability may be improved.

Although the present invention has been described taking an example of a case where the first main surface of the silicon carbide substrate including silicon carbide is set to be a (0001) surface and the MOS gate structure is configured on the (0001) surface, the present invention is not limited hereto and various changes may be made thereto such as the type of the wide bandgap semiconductor (for example, gallium nitride (GaN)) and the plane direction of the substrate main surface. In the embodiments, although the first conductivity type is assumed to be the n-type and the second conductivity type is assumed to be the p-type, the present invention is similarly implemented when the first conductivity type is the p-type and the second conductivity type is the n-type.

According to the present invention, because the p$^+$-type base region is cyclically provided only in the direction parallel to the trench, a striped shape of the p$^+$-type base region and the n$^+$-type region, needing a width of at least 1 μm parallel to the trench is not present between the trench and the adjacent trench. As a result, the problems concerning the processing precision of the striped shape and concerning the design of the n$^+$-type region are not present between the trench and the adjacent trench and therefore, the width of the cell pitch may be reduced. In addition, the electric field applied to the gate insulating film may be mitigated by forming the p$^+$-type base region beneath the trench. As a result, the width of the cell pitch may be reduced to less than 4 μm whereby the chip size may be reduced, and the reliability may be improved.

According to the semiconductor device and the method of manufacturing a semiconductor device of the present invention, an effect is achieved in that reduction of the cell pitch between a trench and another trench is enabled and the reliability may be improved.

As described, the semiconductor device and the method of manufacturing a semiconductor device according to the present invention are useful for a high voltage semiconductor device used in power converting equipment, and power source devices for various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a wide-bandgap semiconductor substrate of a first conductivity type containing a semiconductor material having a bandgap wider than that of silicon;
   a first wide-bandgap semiconductor layer of the first conductivity type provided on a front surface of the wide-bandgap semiconductor substrate, the first wide-bandgap semiconductor layer containing a semiconductor material having a bandgap wider than that of silicon, an impurity concentration of the first wide-bandgap semiconductor layer being lower than that of the wide-bandgap semiconductor substrate;
   a base region of a second conductivity type selectively provided in a first side of the first wide-bandgap semiconductor layer opposite to a second side of the first wide-bandgap semiconductor layer facing toward the wide-bandgap semiconductor substrate;
   a second wide-bandgap semiconductor layer of the second conductivity type provided on a surface on the first side of the first wide-bandgap semiconductor layer opposite to the second side of the first wide-bandgap semiconductor layer facing toward the wide-bandgap semiconductor substrate;
   a source region of the first conductivity type selectively provided in the second wide-bandgap semiconductor layer;
   a plurality of trenches that are parallel to each other, each penetrating the source region and the second wide-bandgap semiconductor layer to reach the first wide-bandgap semiconductor layer;
   a gate electrode provided in each of the trenches, with a gate insulating film disposed therebetween;
   a source electrode contacting the second wide-bandgap semiconductor layer and the source region; and
   a drain electrode on a rear surface of the wide-bandgap semiconductor substrate, wherein
   the base region includes a plurality of first portions that extend in a direction perpendicular to the trench plurality of trenches, the first portions being spaced apart from each other by a same predetermined distance in a direction parallel to the trenches,
   the base region is formed at a bottom end of the trenches and includes a second portion formed at a bottom end of each of the trenches, the second portion extending in a direction parallel to the trenches, the second portion connecting the plurality of first portions of the base region to each other, and
   the base region is free of any portion that extends in a direction parallel to the trenches and that intersects any of the first portions of the base region between two abutting trenches except the second portion.

2. The semiconductor device according to claim 1, wherein
   the base region includes a third portion that extends, in a depth direction, from the first portion of the base region to the second wide-bandgap semiconductor layer.

3. The semiconductor device according to claim 1, wherein
   a width of the second portion of the base region is larger than a width of one of the trenches.

4. The semiconductor device according to claim 1, wherein
   the first wide-bandgap semiconductor layer includes a first side contacting the wide-bandgap semiconductor substrate and a second side opposite the first side, and
   the first wide-bandgap semiconductor layer includes a first region on the first side and a second region on the second side, the second region having an impurity concentration higher than that of the first region.

5. The semiconductor device according to claim 4, wherein
   at least a portion of the second region of the first wide-bandgap semiconductor layer extends to a depth below the base region toward the wide-bandgap semiconductor substrate.

6. The semiconductor device according to claim 4, wherein
   the first wide-bandgap semiconductor layer includes a third region located in the second region, the third region having a higher impurity concentration than the second region.

7. A method of manufacturing the semiconductor device according to claim 1, the method comprising:
   preparing the wide-bandgap semiconductor substrate of the first conductivity type containing the semiconductor material having the bandgap wider than that of silicon;
   forming the first wide-bandgap semiconductor layer of the first conductivity type on the front surface of the wide-bandgap semiconductor substrate;
   selectively forming the base region of the second conductivity type in a surface layer of the first wide-bandgap semiconductor layer;
   forming a region of the first conductivity type on the surface layer of the first wide-bandgap semiconductor layer;
   forming the second wide-bandgap semiconductor layer of the second conductivity type on the surface of the first wide-bandgap semiconductor layer;
   selectively forming the source region of the first conductivity type in the second wide-bandgap semiconductor layer;
   forming the trenches in a striped pattern, as viewed from a plan view from above the trenches, the trenches penetrating the source region and the second wide-bandgap semiconductor layer to reach the first wide-bandgap semiconductor layer;
   forming the gate electrode in each of the trenches, on the gate insulating film;
   forming the source electrode contacting the second wide-bandgap semiconductor layer and the source region; and
   forming the drain electrode on the rear surface of the wide-bandgap semiconductor substrate.

8. A semiconductor device, comprising:
   a wide-bandgap semiconductor substrate of a first conductivity type containing a semiconductor material having a bandgap wider than that of silicon;

a first wide-bandgap semiconductor layer of the first conductivity type provided on a front surface of the wide-bandgap semiconductor substrate, the first wide-bandgap semiconductor layer containing a semiconductor material having a bandgap wider than that of silicon, an impurity concentration of the first wide-bandgap semiconductor layer being lower than that of the wide-bandgap semiconductor substrate;

a base region of a second conductivity type selectively provided in a first side of the first wide-bandgap semiconductor layer opposite to a second side of the first wide-bandgap semiconductor layer facing toward the wide-bandgap semiconductor substrate;

a second wide-bandgap semiconductor layer of the second conductivity type provided on a surface on the first side of the first wide-bandgap semiconductor layer opposite to the second side of the first wide-bandgap semiconductor layer facing toward the wide-bandgap semiconductor substrate;

a source region of the first conductivity type selectively provided in the second wide-bandgap semiconductor layer;

a plurality of trenches that are parallel to each other, each penetrating the source region and the second wide-bandgap semiconductor layer to reach the first wide-bandgap semiconductor layer;

a gate electrode provided in each of the trenches, with a gate insulating film disposed therebetween;

a source electrode contacting the second wide-bandgap semiconductor layer and the source region; and a drain electrode on a rear surface of the wide-bandgap semiconductor substrate, wherein the base region includes a plurality of first portions that extend in a direction perpendicular to the trenches, the first portions being spaced apart from each other by a same predetermined distance in a direction parallel to the trenches, and a plurality of second portions, each of which extends in a direction parallel to the trenches, at a bottom end of a corresponding one of the trenches, and each of the first portions of the base region connects two adjacent second portions of the base region without intervening any other portion of the base region between two abutting trenches.

* * * * *